US010199048B2

(12) United States Patent
Christoph

(10) Patent No.: US 10,199,048 B2
(45) Date of Patent: Feb. 5, 2019

(54) BASS ENHANCEMENT AND SEPARATION OF AN AUDIO SIGNAL INTO A HARMONIC AND TRANSIENT SIGNAL COMPONENT

(71) Applicant: HARMAN BECKER AUTOMOTIVE SYSTEMS GMBH, Karlsbad (DE)

(72) Inventor: Markus Christoph, Straubing (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 78 days.

(21) Appl. No.: 15/353,327

(22) Filed: Nov. 16, 2016

(65) Prior Publication Data

US 2017/0148453 A1 May 25, 2017

(30) Foreign Application Priority Data

Nov. 19, 2015 (EP) .................................... 15195381

(51) Int. Cl.
*H03G 5/00* (2006.01)
*H04R 3/04* (2006.01)
(Continued)

(52) U.S. Cl.
CPC ........ *G10L 19/0208* (2013.01); *G10L 19/265* (2013.01); *H04R 3/04* (2013.01)

(58) Field of Classification Search
CPC ....... G10L 19/025; G10L 19/26; G10L 19/02; G10L 19/0204; G10L 19/265;
(Continued)

(56) References Cited

U.S. PATENT DOCUMENTS 9,172,342 B2 * 10/2015 Villemoes ............. G10L 21/038
2007/0253576 A1 11/2007 Bai et al.
(Continued)

FOREIGN PATENT DOCUMENTS

EP 2670050 A2 12/2013

OTHER PUBLICATIONS

Fitzgerald, "Harmonic/Percussive Separation Using Median Filtering", Proc. of the 13th Int. Conference on Digital Audio Effects (DAFx-10), Graz, Austria, Sep. 6-10, 2010, 4 pages.
(Continued)

*Primary Examiner* — Thang V Tran
(74) *Attorney, Agent, or Firm* — Brooks Kushman P.C.

(57) ABSTRACT

A method for separating an audio signal into a harmonic signal component and a transient signal component is disclosed. The method includes the steps of: transferring the audio signal into a frequency space in order to obtain a transferred audio signal in dependence on frequency and time and applying a non-linear smoothing filter to the transferred audio signal over frequency to obtain a filtered transient signal in which the harmonic signal component is suppressed relative to the transient signal component. The method further includes applying the non-linear smoothing filter to the transferred audio signal over time to obtain a filtered harmonic signal in which the transient signal component is suppressed relative to the harmonic signal component and determining the harmonic signal component and the transient signal component based on the filtered harmonic signal and the filtered transient signal.

23 Claims, 17 Drawing Sheets
(12 of 17 Drawing Sheet(s) Filed in Color)

(51) Int. Cl.
*G10L 19/02* (2013.01)
*G10L 19/26* (2013.01)

(58) Field of Classification Search
CPC .... G10L 21/0208; H03G 5/005; H03G 5/165; H03G 21/038; H04R 3/00; H04R 3/04; H04R 3/14
See application file for complete search history.

(56) References Cited

U.S. PATENT DOCUMENTS

2013/0051571 A1* 2/2013 Nagel ................. G10L 19/0204 381/56
2013/0322652 A1* 12/2013 Kudryavtsev ............ H03G 3/20 381/107
2016/0171985 A1* 6/2016 Reams .................. G10L 19/028 381/99

OTHER PUBLICATIONS

Extended European Search Report for Application No. 15195381.7, dated Mar. 30, 2016, 9 pages.

* cited by examiner

BASS ENHANCEMENT AND SEPARATION OF AN AUDIO SIGNAL INTO A HARMONIC AND TRANSIENT SIGNAL COMPONENT

CROSS-REFERENCE TO RELATED APPLICATIONS

This application claims priority to EP application Serial No. 15195381.7 filed Nov. 19, 2015, the disclosure of which is hereby incorporated in its entirety by reference herein.

TECHNICAL FIELD

Various embodiments relate to techniques for separating an audio signal into a harmonic signal component and a transient signal component, to a method for generating a bass enhanced audio signal. Furthermore, an audio component configured to generate a bass enhanced audio signal is provided.

BACKGROUND

From a physical point of view, loudspeakers with a small membrane and a low depth are not able to generate a change in volume needed for the playback of low frequencies. Simply put, one can say that small speakers are unable to provide enough bass. One way to circumvent this problem is to use what is called a harmonic continuation which utilizes the psychoacoustic effect that our hearing system is able to detect and hence perceive a fundamental out of its harmonics even if the former is not present in the perceived signal.

Another possibility exists which uses an exact modelling of the used loudspeaker. If this modelling is possible, an element called mirror filter can be used, which is able to distort the input signal in advance so that in sum i.e., under consideration of the non-linear distortions of the loudspeaker, again a linear system is generated. In this way, the physical boundaries of the speaker can be extended towards lower frequencies. However, this method is much more complex and should be mentioned at this point only for the sake of completeness.

In most cases, the above-discussed principles are used which are based on the effect of harmonic continuation. All of the systems are non-linear and therefore cause distortions that have to be kept acoustically as low as possible. In the technical field, it is known that good results are obtained if the input signal is separated into the harmonic and percussive or transient signal component. Here, good results in terms of low acoustic artefacts are achieved when the harmonic continuation of the transient signal component is obtained with the aid of a non-linear function and if the harmonic signal component is obtained with the use of a phase vocoder. The appropriate non-linear function as well as the use of the phase vocoder for this purpose is known. However, in currently used systems, the methods for separating the signal into the harmonic signal component and the transient signal component suffer from a high computational effort and high memory needs.

SUMMARY

Accordingly, a need exists to improve the possibility to separate an audio signal into its harmonic and transient signal components.

This need is met by the features of the independent claims. Further aspects are described in the dependent claims.

According to one aspect, a method for separating an audio signal into a harmonic signal component and a transient signal component is provided in which the audio signal is transferred into a frequency space in order to obtain a transferred audio signal in dependence on frequency and time. Furthermore, a non-linear smoothing filter is applied to the transferred audio signal over the frequency domain in order to obtain a filtered transient signal in which the harmonic signal component is suppressed relative to the transient signal component. The non-linear smoothing filter is furthermore applied to the transferred audio signal over time in order to obtain a filtered harmonic signal in which the transient signal component is suppressed relative to the harmonic signal component. The harmonic signal component and the transient signal component is then determined based on the filtered harmonic signal and the filtered transient signal. The transferred audio signal is a signal depending on time and frequency. By applying a simple non-linear filter over the frequency the harmonic signal component is suppressed, whereas when the same filter is applied over time, the transient signal component is suppressed. Based on the filtered harmonic signal and the filtered transient signal, it is then possible to determine the harmonic signal component and the transient signal component. The computational load and the memory need for the implication of the non-linear filter is low and much lower compared to a system in which, for example, median filter is used.

Furthermore, a method for generating a bass enhanced audio signal based on harmonic continuation is provided in which the audio signal is separated into a harmonic signal component and transient signal component as mentioned above. Furthermore, a non-linear function is applied to the transient signal component in order to generate a distorted non-linear signal having desired non-linear distortions. The harmonic signal component is processed in a phase vocoder in order to generate an enriched audio signal in which harmonic frequency components are added. The distorted non-linear signal and the harmonic enriched signal are then weighted with corresponding weight factors and combined in order to form the bass enhanced audio signal.

Furthermore, the corresponding entities for separating the audio signal and for generating the bass enhanced audio signal are provided.

Additionally, a computer program comprising program code to be executed by at least one processing unit of an entity configured to separate the audio signal into the harmonic and transient signal components is provided wherein execution of the program code causes the at least one processing unit to execute a method as mentioned above and as mentioned in further detail below.

Features mentioned above and features yet to be explained below may not only be used in isolation or in combination as explicitly indicated, but also in other combinations. Features and embodiments of the present application may be combined unless explicitly mentioned otherwise.

BRIEF DESCRIPTION OF THE DRAWINGS

Various features of embodiments of the present application will become more apparent when read in conjunction with the accompanying drawings. This application contains at least one drawing executed in color. In these drawings.

DETAILED DESCRIPTION

Figure 1:
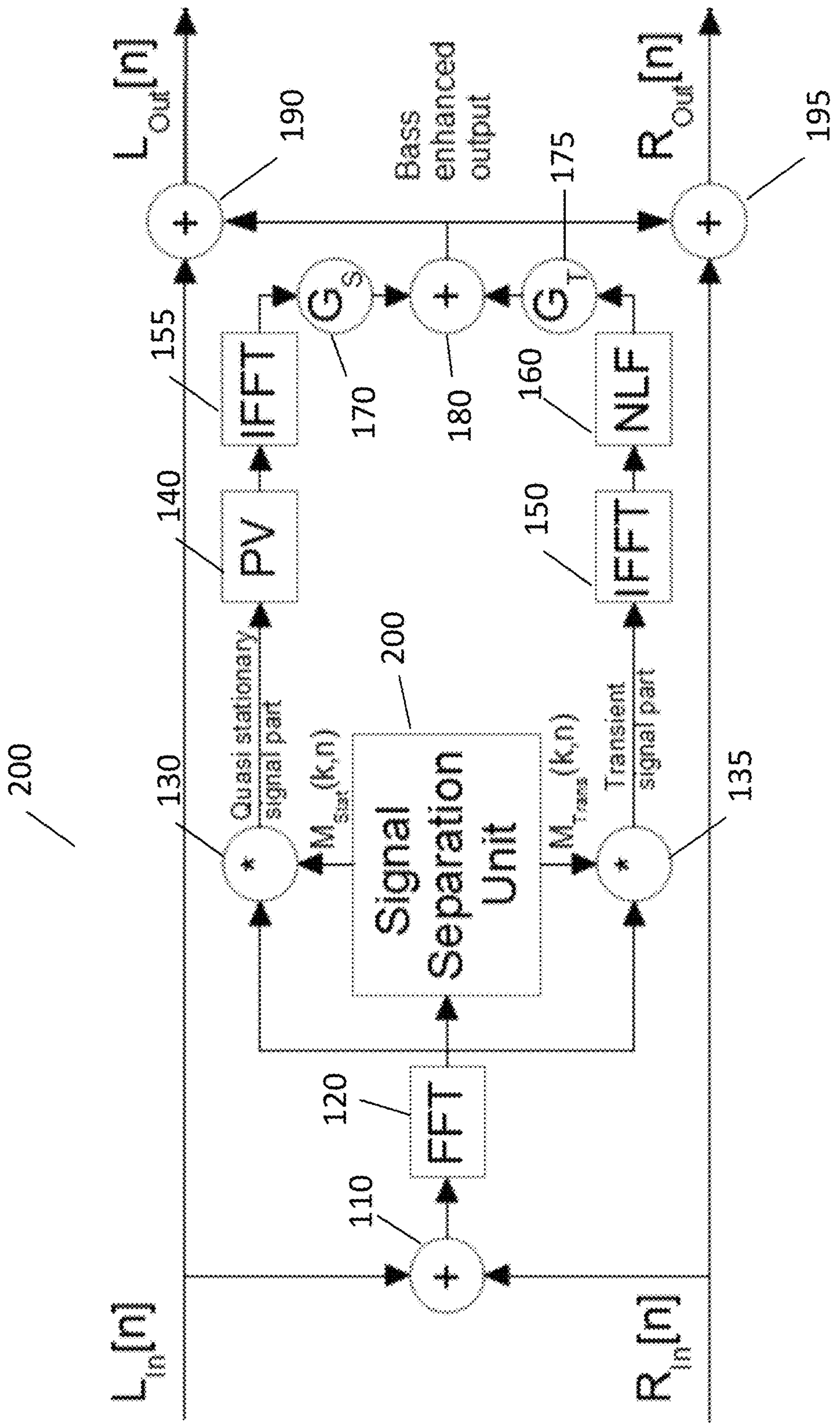
FIG. 1 is a schematic representation of a signal flow in a hybrid system used for bass enhancement according to an embodiment.

In the following, embodiments of the application will be described in detail with reference to the accompanying drawings. It is to be understood that the following description of embodiments is not to be taken in a limiting sense. The scope of the invention is not intended to be limited by the embodiments described herein of by the drawings, which are to be taken demonstratively only.

The drawings are to be regarded as being schematic representations and elements illustrated in the drawings are not necessarily shown to scale. Rather, the various elements are represented such that their function and general purpose becomes apparent for a person skilled in the art. Any connection or coupling between functional blocks, devices, components or other physical or functional components shown in the drawings or described herein may also be implemented by indirect connection or coupling. A coupling between components may also be established over a wireless connection, unless explicitly stated otherwise. Functional blocks may be implemented in hardware, firmware, software or a combination thereof.

Hereinafter, techniques are described which allow an audio signal to be separated into a harmonic signal component and a transient signal component. The signal separation can then be used for bass enhancement of an audio signal based on the acoustic effect of harmonic continuation, for example. In connection with FIG. 1, a system will be explained in which a signal is separated into a harmonic signal component and a transient signal component using a non-linear smoothing filter, wherein the separated signals are used for signal enhancement based on the effect of harmonic continuation.

As shown in FIG. 1, a stereo input signal including a left and a right signal component $L_{in}$, $R_{in}$ are added in adder 110 in order to generate a mono audio signal. The parameter n shown in FIG. 1 indicates the time. The mono signal output from adder 110 is fed to an entity 120 configured to generate a fast Fourier transform of the signal so that the signal is transferred from the time into the frequency domain. This transferred signal is then fed to an entity 200, which is called signal separation unit in FIG. 1. As will be explained in further detail in connection with FIG. 2 later on, the transferred audio signal is separated into a harmonic signal component and the transient signal component in entity 200. This separation is obtained with the help of a spectral weighting or masking in different frequency bins k, wherein the spectrum weighting changes over time n. Thus, a mask $M_{Stat}(k, n)$ is used to generate the stationary or harmonic signal component and mask $M_{Trans}(k, n)$, is used to generate the transient signal component. As shown in FIG. 1, the mask is then applied to the transferred audio signal in order to obtain the quasi-stationary signal part and the transient signal part. The spectrum of the quasi-stationary or harmonic signal part is then fed to a phase vocoder 140. In the phase vocoder, a spectral analysis of the harmonic signal component is carried out, which then forms the basis for the generation of the harmonic continuation before the thus modified signal is transferred to the time domain in entity 155, where the inverse Fourier transform is applied. The transient signal component is transferred from the frequency space into the time space in entity 150 and in a non-linear filter 160 the desired non-linear distortions are generated. Both signal components are then weighted with corresponding weighting factors $G_S$ and $G_T$ before the signals are combined in adder 180. The bass enhanced output is then combined with the stereo input signal, i.e. the corresponding component, in order to generate a left and right output signal $L_{out}$ and $R_{out}$ as shown in FIG. 1.

Figure 2:
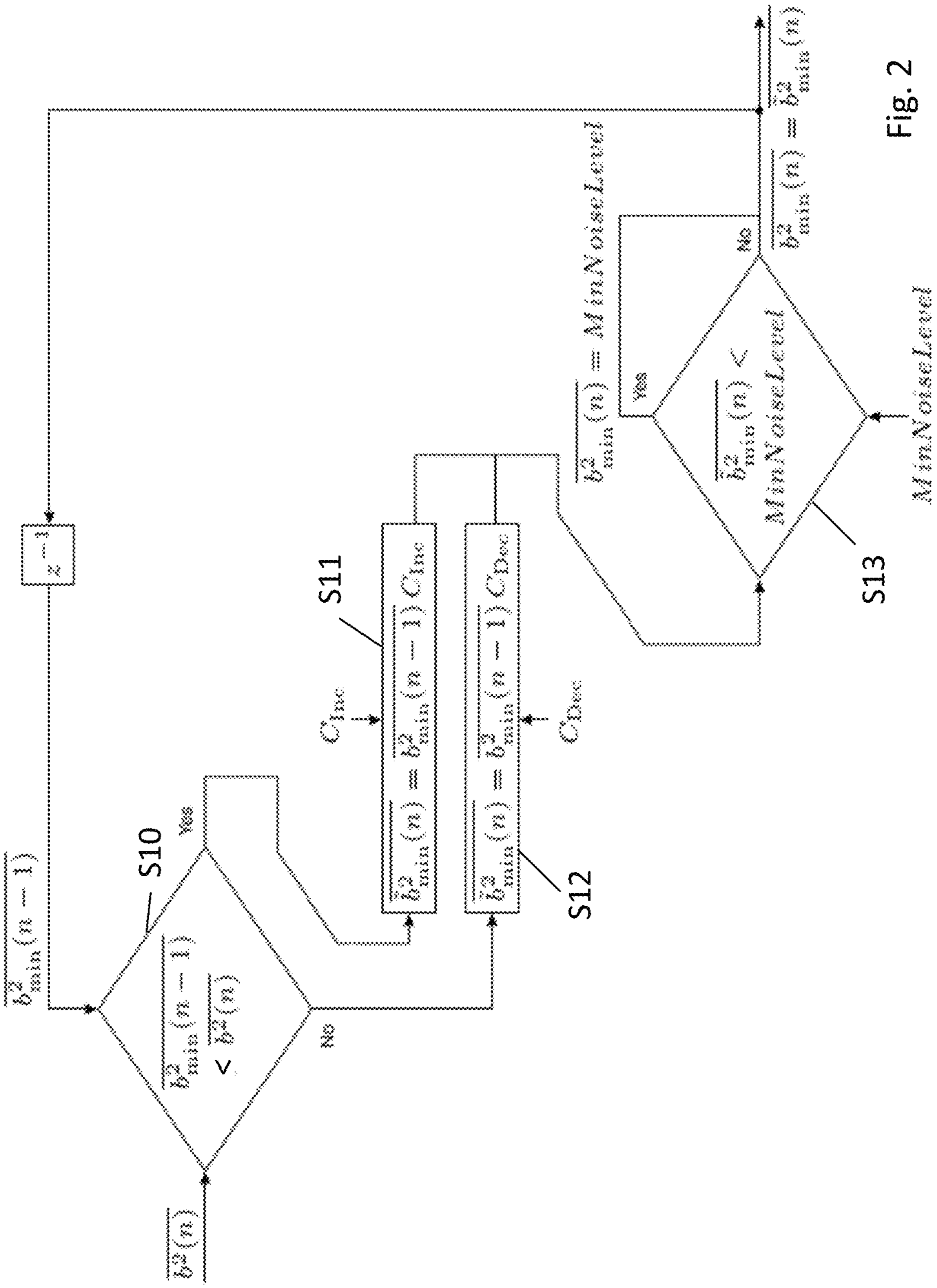
FIG. 2 is a schematic representation of a signal flow diagram of a non-linear filter used in the system of FIG. 1 to separate the audio signal into a harmonic and a transient signal component.

FIG. 2 shows the signal flow of a non-linear smoothing filter as used within entity 200, the signal separation unit, to separate the audio signal into a harmonic signal component and a transient signal component. The transient or percussive signal components have a nearly white spectrum. This can be seen by example of a Kronecker-Delta input signal, also called Dirac impulse signal, which has a continuous spectrum. A harmonic or quasi-stationary signal has an unchanged spectrum over time. By way of example, a sinus signal, which does not change over time has a line in the spectrum that does not change over time. If these two signal components should be separated, it is possible for the separation of the transient signal component to smooth the spectrum over the frequency with the aid of a non-linear filter in order to suppress the quasi stationary or harmonic signal components. In the same way, in order to extract the harmonic signal components of the spectrum, each spectrum line or each bin in the spectrum can be smoothed by applying a non-linear filter over time in order to suppress the transient signal components. Thereby the non-linear smoothing filter should not distribute the input energy over time in dependence of the selected smoothing coefficients so that the input energy is maintained, as an ordinary smoothing filter does, but should suppress the present short energy peaks in the spectrum, instead. This is a non-linear process in which the energy is not constant. To this end, as mentioned, a non-linear smoothing filter is needed.

In FIG. 2, the input signal $\overline{b^2(n)}$ is the input signal to the signal that was optionally smoothed over time and $\overline{b_{min}{}^2(n)}$ is the non-linearly smoothed output signal. The functioning of the filter can be described mathematically as follows:

$$\overline{b_{min}^2(n)} = \begin{cases} \max\{MinNoiseLevel,\ C_{Inc}\overline{b_{min}^2(n-1)}\}, & \text{if } \overline{b^2(n)} > \overline{b_{min}^2(n-1)} \\ \max\{MinNoiseLevel,\ C_{Dec}\overline{b_{min}^2(n-1)}\}, & \text{else} \end{cases} \tag{1}$$

As can be deduced from FIG. 2 and formula 1, the input signal $\overline{b^2(n)}$ is compared to the output signal (step S10). If the input signal is larger than the output signal, the increment situation occurs and a new output signal, i.e. the former input signal after having passed the filter, is incremented by an increment $C_{Inc}$, with $C_{Inc} \geq 1$ (step S11). The other situation, i.e., when the input signal is smaller than the output signal, the new output signal is decremented by a decrement $C_{Dec}$, with $C_{Dec} < 1$ (step S12). Furthermore, it is checked in step S13 whether the signal is smaller than a minimum threshold. If this is the case, the signal is set to a minimum threshold which is a minimum noise level. Step S13 helps to ensure that the signal is always above the minimum threshold and is not decremented too strongly. This is necessary in order to make sure that the reaction after the start of the signal input or after a longer pause is not too lethargic.

The values $C_{Inc}$ and $C_{Dec}$ may be constant and the decrease may be larger than the corresponding increase. In another embodiment, the parameter $C_{Inc}$ may also be self-adaptive. By way of example, $C_{Inc}$ may start with a first value in order to increase the new output signal when the new output signal is increased for a first time. Each time the new output signal is further increased, the first value may be increased by a first Δ until a maximum first amount is obtained. If the increment part of the signal evaluation is left and the decrement occurs, the first amount may be set again to the first value.

The non-linear smoothing filter of FIG. 2 is applied twice. It is applied a first time over frequency, wherein the input signal for one frequency component is compared to an output signal of the non-linear filter of a neighboring frequency component to which the non-linear smoothing filter has already been applied in order to obtain a new output of the non-linear smoothing filter for said one frequency component. By way of example, when the system starts, an input signal at time t for a first frequency component n=1 is used and the system is initialized as shown by the following example with X (n, t) being the input signal and Y (n, t) being the output signal. When the system starts, the first frequency component n=1, Y (n=1, t)=X (n=1, t). Both values may be set to the minimum threshold. For n>1 the following processing is carried out for different frequencies: Input value X (n, t) is compared to the output signal of the former frequency component Y (n−1, t). If X (n, t) is larger than Y (n−1, t), the incrementation is valid, which means then Y (n, t)=Y (n−1, t)×$C_{Inc}$, with $C_{Inc} \geq 1$. If X (n, t)<Y (n−1, t), the decrement situation applies so that Y (n, t)=Y (n−1, t)×$C_{Dec}$, with $C_{Dec} < 1$.

In the second application, the non-linear smoothing filter is applied over time in which the input signal for one time component is compared to an output signal of the non-linear filter of a neighboring time component to which the non-linear filter has already been applied to get a new output signal of the non-linear smoothing filter for said one time component.

Another method known in the art uses a median filter of order of 15 to 30, for example, 17. This means that for the separation of the harmonic signal component and the transient signal component, the data of the last 15-30 spectra have to be kept in the memory in order to determine the median for each spectral line so that the non-linear smooth spectrum of the output signal can be obtained, which in this case corresponds to the harmonic signal component.

If this median filter of order 17 is compared to the above-discussed smoothing filter of FIG. 2, it can be deduced that the newly proposed method, whether it is applied over frequency or time, only needs a single set for the spectrum in the memory. As a consequence, the above-described filtering reduces the memory need for signal separation in dependence of the used order of the median filter by a factor of around 10, if the median filter of the $19^{th}$ order or larger is used.

In the following, we will discuss in connection with FIGS. 3-7 the performance of a known median filter used for the separation. We will then apply the filter of FIG. 2 to the same signal as will be discussed in connection with FIGS. 8-11 in order to be able to compare the performance of both approaches.

Figure 3:
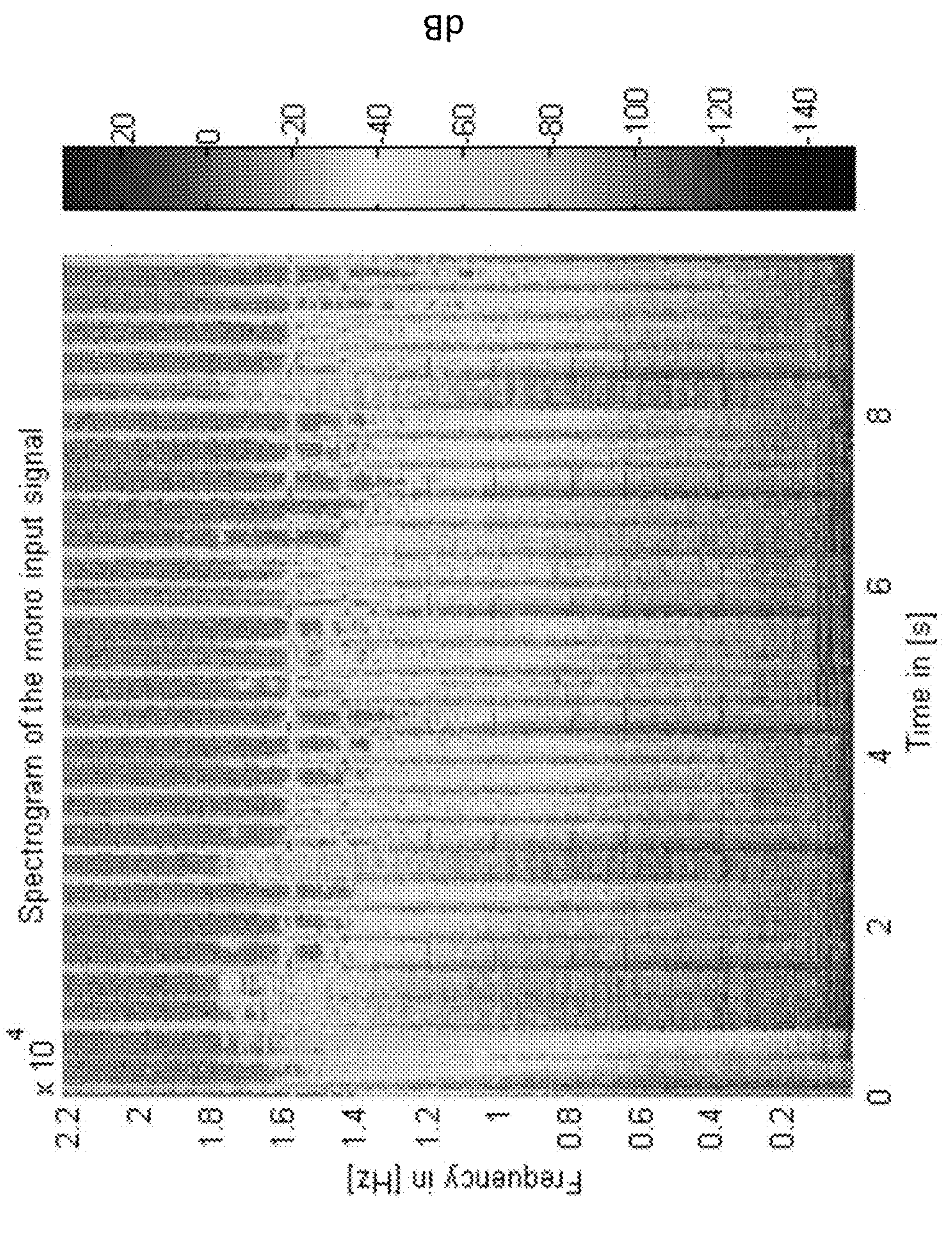
FIG. 3 shows an example of a spectrogram of a mono audio input signal which should be separated into the two components.

FIG. 3 shows a spectrum of a mono signal which was generated based on a typical stereo music signal. As can be deduced from FIG. 3, a spectrogram contains transient or percussive signal components which are visible as vertical lines at the corresponding time segments. The signal also contains harmonic or quasi-stationary signal components which can be seen from the horizontal lines. The harmonic signal component in the spectrum thus indicates that the same frequency is present in the audio signal over time. As can be further deduced from FIG. 3, the input signal has more transient signal components than harmonic signal components. The scale on the right side describes the dB values from minus 140 to plus 20. In the following, a median filter of order 17 as known in the art is applied for the signal separation as will be discussed in connection with FIGS. 4-7.

The median filter operates as follows:

- A data vector the length (order) of the median filter is generated.
- The values of the data vector are sorted with increasing values. The value in the middle of the data vector is used when the data vector has an odd length, whereas the mean of the two middle values is used when the length (order) of the median filter is an even number. This value then represents the smoothed output value of the non-linear median filter.

Figure 4:
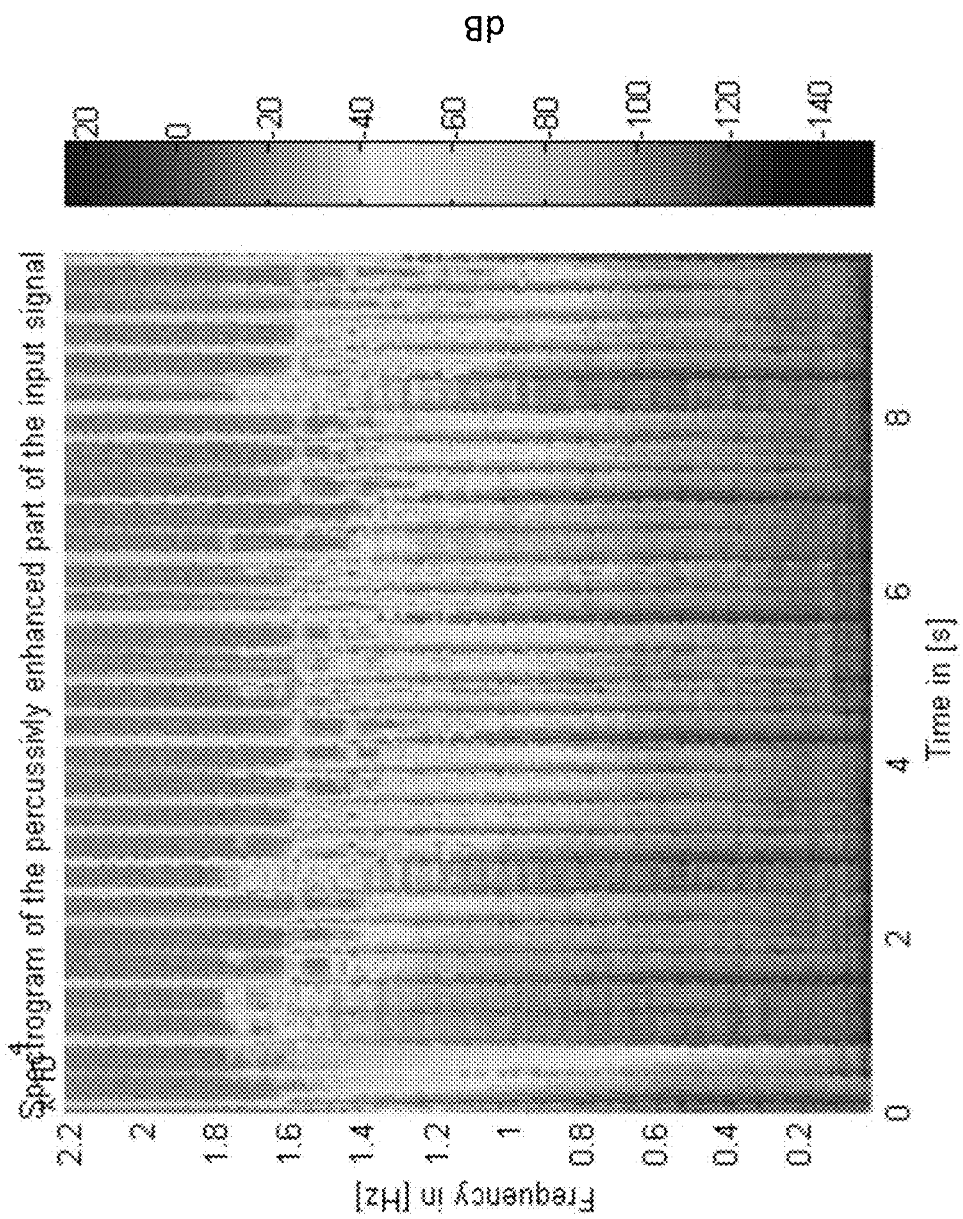
FIG. 4 shows the spectrogram of the transient signal component after a median filter of order 17 was applied.

If this median filter is applied over the frequency i.e., over the vertical lines of FIG. 3, one obtains the transient signal component T (n, k) as shown in FIG. 4. The spectrum of the transient signal component $\hat{T}$ (n, k) is obtained by weighting the input spectrum of FIG. 3 X (n, k) over time with a corresponding spectral mask which changes over time n $M_T$ (n, k), wherein a separate weighting is done for all spectral bins $$k = \left[0, \ldots \frac{N}{2}\right],$$

with N being the length of the fast Fourier transform. The mask for this reads as follows:

$$\hat{T}(n,k)=X(n,k)M_T(n,k), \quad (2)$$

Figure 5:
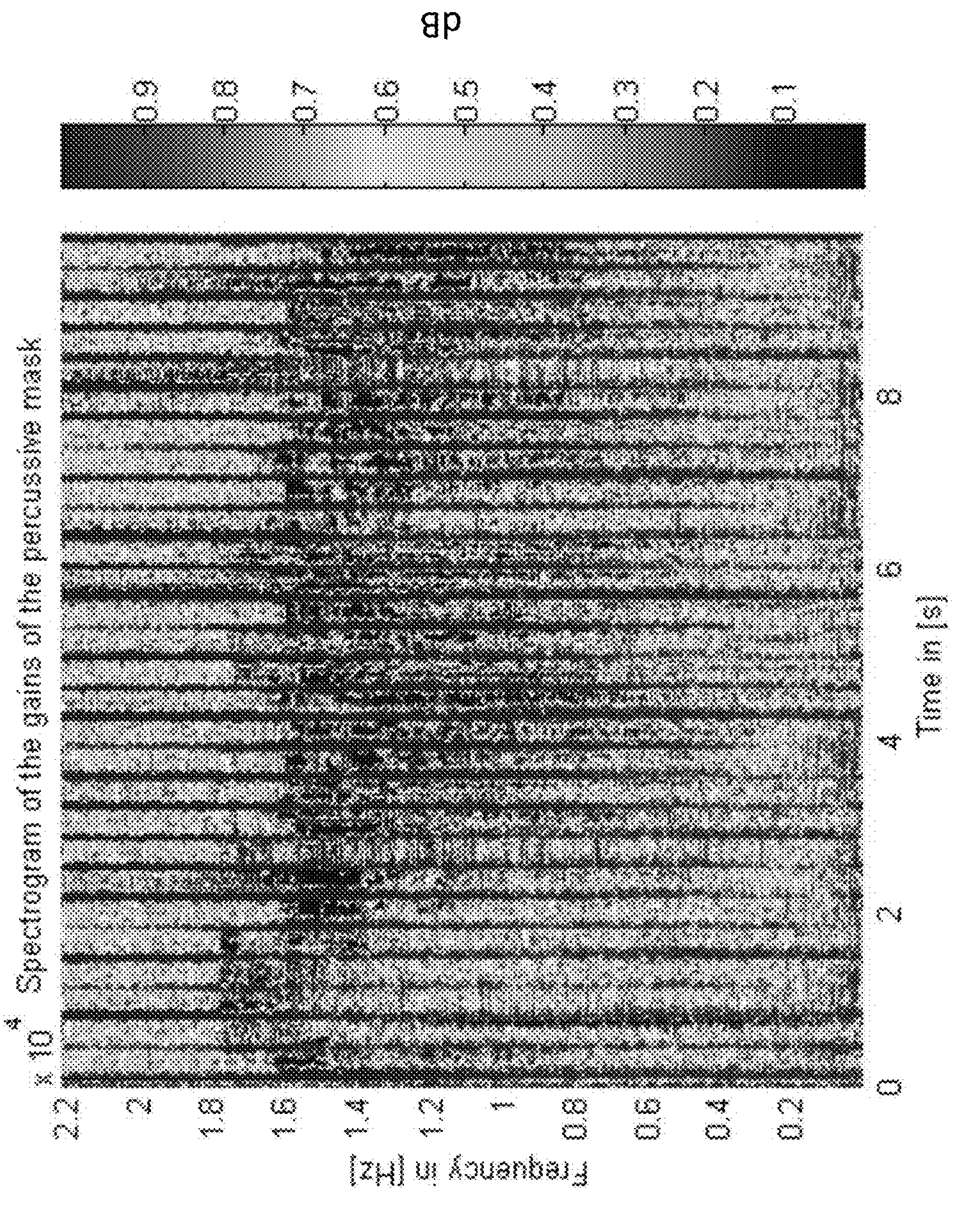
FIG. 5 shows the spectrogram of a mask obtained with the use of a median filter of order 17.

FIG. 5 now shows the spectrogram of the weighting mask which was generated with the help of the median filter of order 17 and with which the mono input signal has to be weighted in order to obtain the transient signal component from the input signal. As can be seen from FIG. 5, the weighting matrix $M_T$ can be used to identify the transient signal components and can be recognized from the dark vertical lines in which the gain is approximately one. This means that the signal components of the input spectrum can pass the mask undisturbed and are thus maintained, whereas the other part between the vertical lines represents a suppression of the corresponding region of the spectrum.

Figure 6:
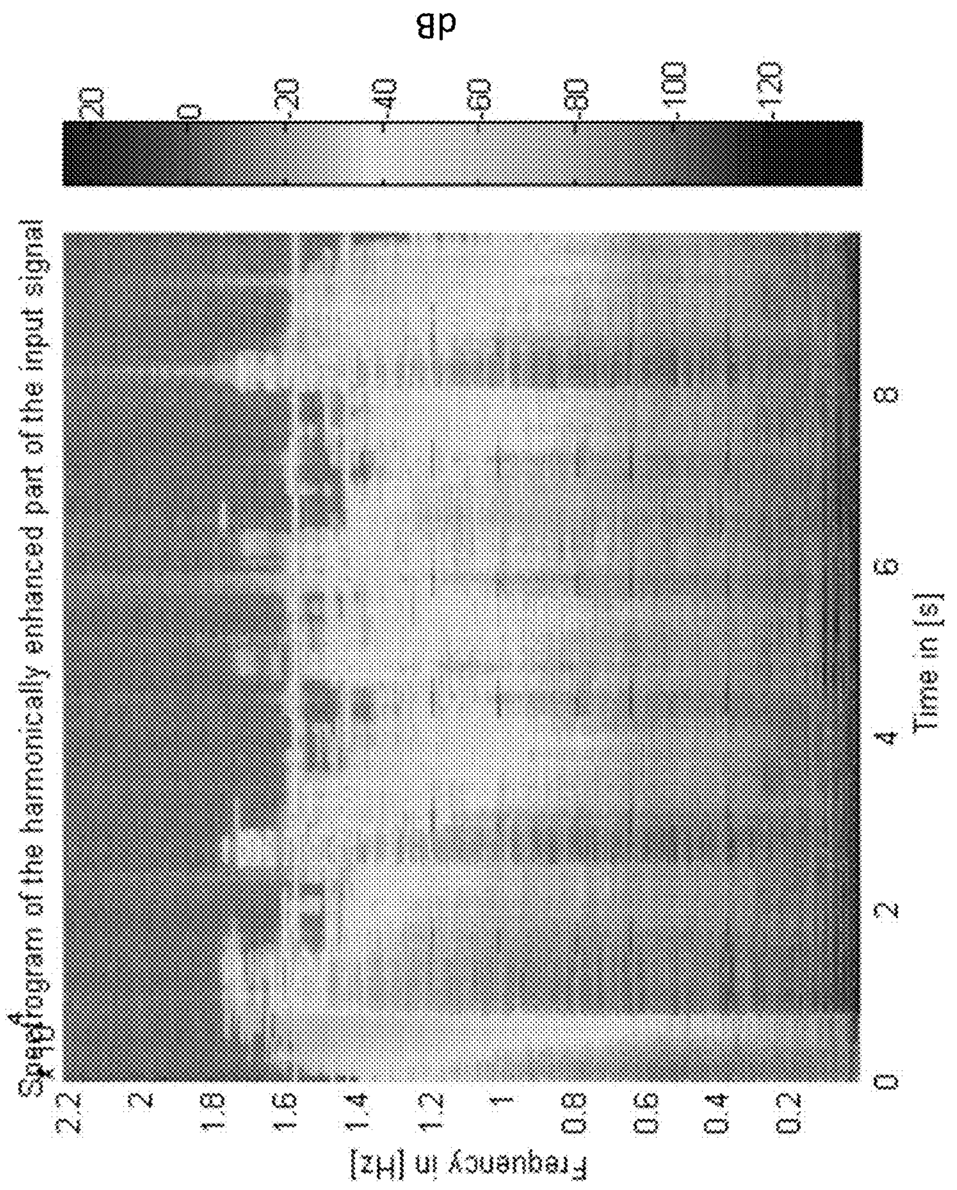
FIG. 6 shows an example of the spectrogram of the harmonic signal component generated with the help of the median filter of order 17.

FIG. 6 shows when the median filter is applied over the time so that the spectrum S (n, k) is obtained, which represents the harmonic signal component. FIG. 6 shows the spectrum that was obtained with the use of the median filter mentioned above and it can be deduced from this figure that the percussive or transient signal components are heavily suppressed compared to the embodiment of FIG. 4, where the signal now comprises more the horizontal lines. The spectrum of the transient signal component $\hat{S}$ (n, k) is obtained by applying spectral mask $M_S$ (n, k) to the input signal X (n, k), wherein the mask changes over time n. The corresponding math is seen in formula 3:

$$\hat{S}(n,k)=X(n,k)M_S(n,k) \quad (3)$$

Figure 7:
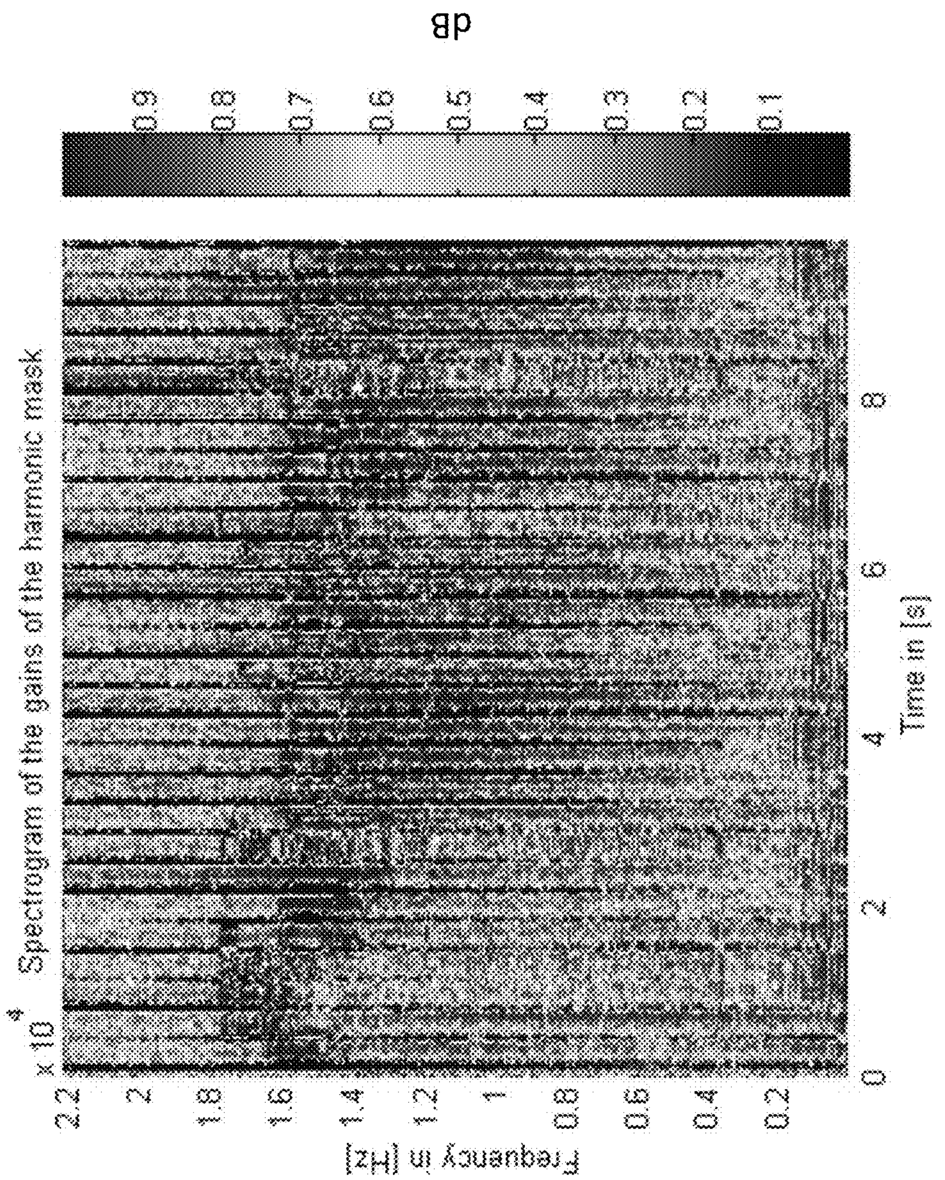
FIG. 7 shows an example of a spectrogram of the mask generated with the help of the median filter of order 17.

FIG. 7 shows the spectrum of this mask. In this mask, the percussive signal components are suppressed, which corresponds to the dark horizontal lines having a value between 0.1 and 0.3 in the scale shown in FIG. 7. The other components between the vertical lines have a high transmission rate. Thus, FIG. 7 shows the weighting mask obtained with a median filter of order 17. The application of this mask results in the harmonic signal component.

As discussed above, the application of the median filter in the vertical direction, over the frequency leads to an estimation of the transient signal T (n, k), wherein the application over the time leads to the harmonic signal component S (n, k). These signals T (n, k) and S (n, k) are, however, not directly used for the further processing as this would lead to differences between the input and the output signal due to the non-linear character of the median filter. Thus, this means that X (n, k)≠T (n, k)+S (n, k). In order to avoid this situation, the masks are used meaning the generation of the output signal based on formulas (2) and (3) mentioned above. Based on the spectrum T (n, k) and S (n, k), the masks $M_T$ (n, k) and $M_S$ (n, k) can be generated such that X(n, k)=$\hat{T}$ (n, k)+$\hat{S}$ (n, k).

The calculation of the two masks can be determined as follows:—

$$M_T(n,k) = \frac{T^2(n,k)}{T^2(n,k)+S^2(n,k)} \quad (4)$$

$$M_S(n,k) = \frac{S^2(n,k)}{T^2(n,k)+S^2(n,k)}$$

where: $M_T$ (n, k) corresponds to the transient filter mask; $M_S$ (n, k) corresponds to the harmonic filter masks; T (n, k) is defined as the transient signal; and S (n, k) is defined as a harmonic signal component. As the masks $M_T$ (n, k) and $M_S$ (n, k) only contain amplification values which sum up to one ($M_T$ (n, k)+$M_S$ (n, k)=1 for all n, k), it can be concluded that the energy is maintained, meaning that the input energy corresponds to the output energy. In the same way, the phase response does not change. This helps to avoid annoying acoustic artefacts, which would occur otherwise. The filter used for the generation of the signals explained in connection with FIGS. 4-7 describe one solution. However, if the use of the median filter is considered in more detail, it can be deduced that the effort for the application of this filter is quite high. First of all, one has to extract a data vector over the time and over the frequency in the length of the median filter and has to sort the values in order to obtain the output values and this has to be carried out for each time index n as for each spectral bin k. This is a high computational effort. Furthermore, for the calculation of the median filter, a number of spectra corresponding to the order of the median filter have to be present and stored, which leads to a high increase of storage space. Thus, in total, the use of the median filter is not efficient.

Figure 8:
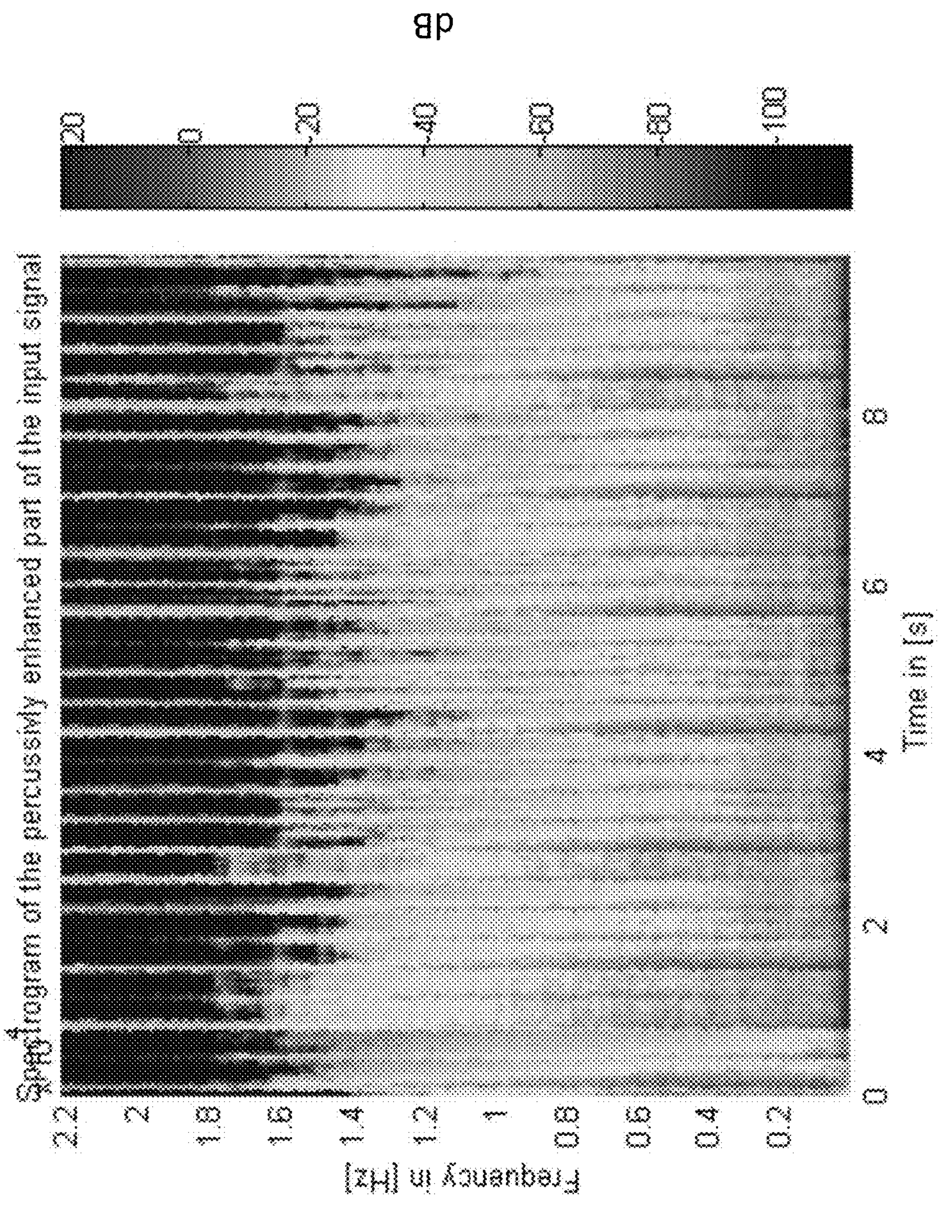
FIG. 8 shows an example of a spectrogram of the transient signal component of a mono audio input signal which was generated with the non-linear filter of FIG. 2 according to an embodiment.

FIG. 8 now shows the application of the filter of FIG. 2 over the frequency i.e., over the vertical lines of the spectrum. Furthermore, the following parameters for $C_{Inc}$ and $C_{Dec}$ are used $C_{Inc}$=20 dB/s and $C_{Dec}$=80 dB/s. The calculation of the values is as follows:

$$C_{Inc}=10\hat{}((C_{Inc}\_dB*HopSize/20)/fs) \text{ and } C_{Dec}=10\hat{}-((C_{Dec}\_dB*HopSize/20)/fs),$$

fs being the sampling frequency in [Hz].

Figure 9:
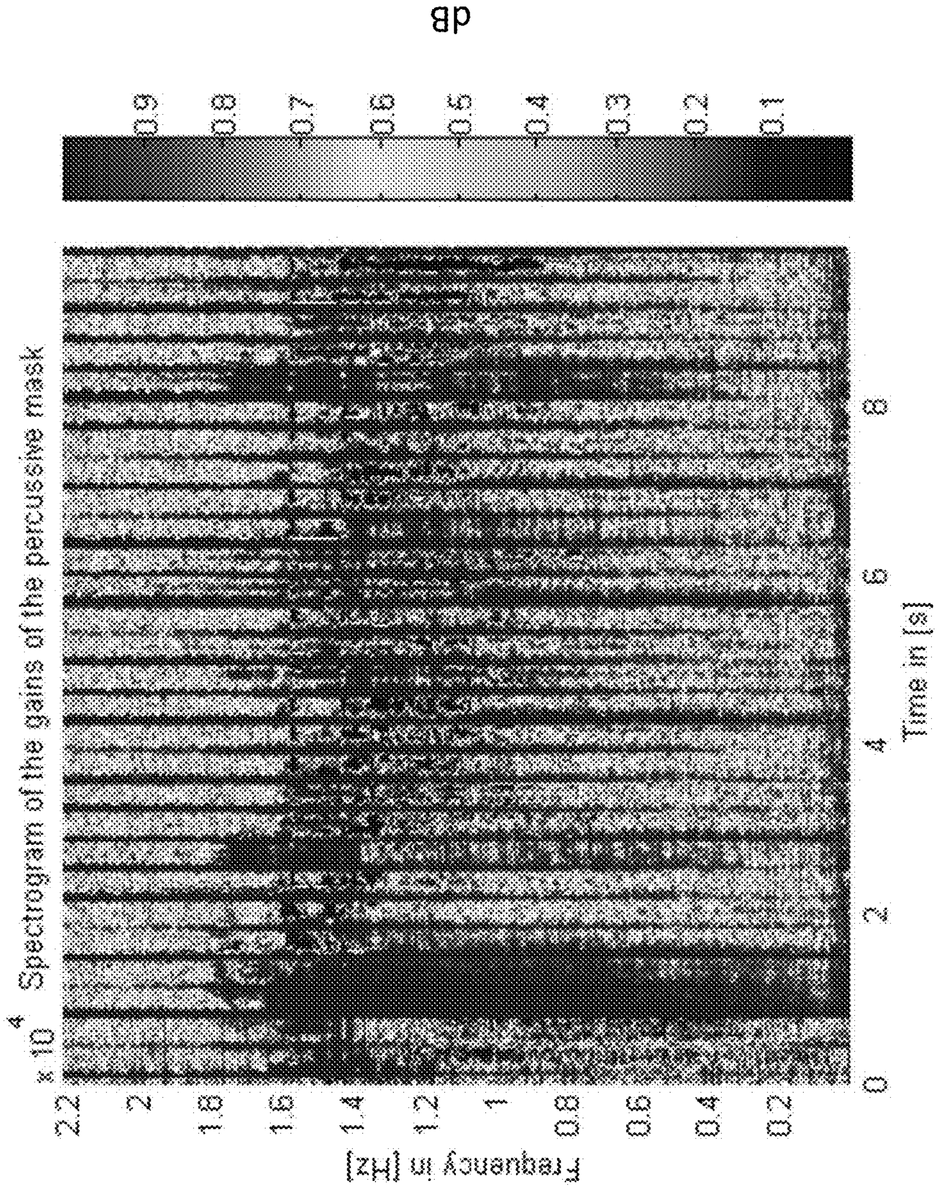
FIG. 9 shows an example of a spectrogram of a mask which was generated with the help of the non-linear filter of FIG. 2.
Figure 10:
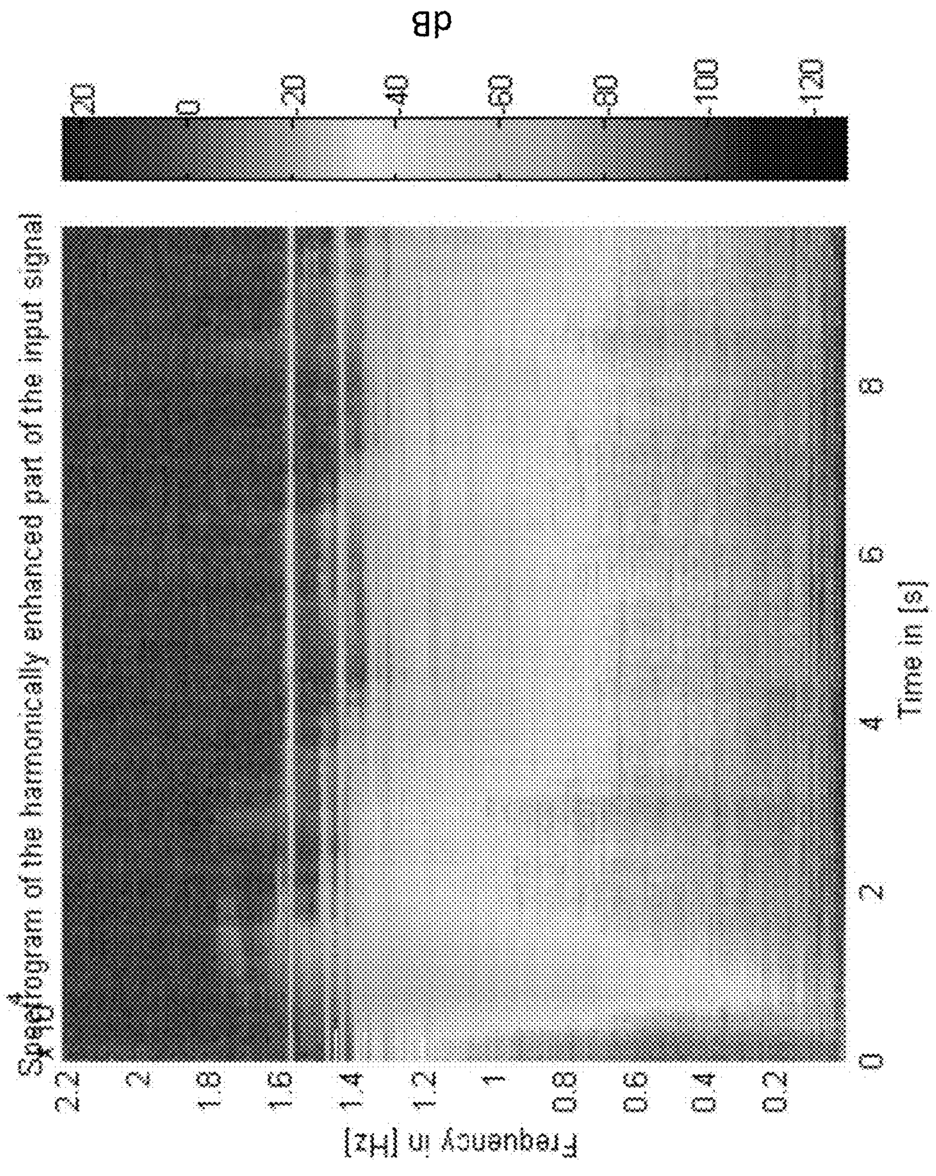
FIG. 10 shows a spectrogram of the harmonic signal component obtained with the help of the non-linear smoothing filter of FIG. 2.

The HopSize is the input frame shift in samples e.g., the HopSize is the length of the Fourier transform/4. FIG. 8 now shows a spectrum of the transient signal component obtained with the non-linear smoothing filter of FIG. 2. Similar to the use of the median filter, the transient signal components are maintained, whereas the harmonic signal components are suppressed. FIG. 9 shows the spectrogram of the mask generated with the help of the non-linear smoothing filter and which has to be applied to the input signal in order to obtain the transient signal components. The mask shows that at the beginning a transient response is present, which, however, does not negatively influence the overall performance. The dark vertical stripes indicate that these signal components are passed and not suppressed, whereas the other signal components outside the dark vertical stripes are more heavily suppressed. FIG. 10 shows the spectrum of the harmonic signal component obtained with the non-linear smoothing filter. It can be seen that the percussive signal components are greatly suppressed, stronger compared to the median filter. However, the harmonic signal components are not emphasized as much compared to the use of a median filter.

Figure 11:
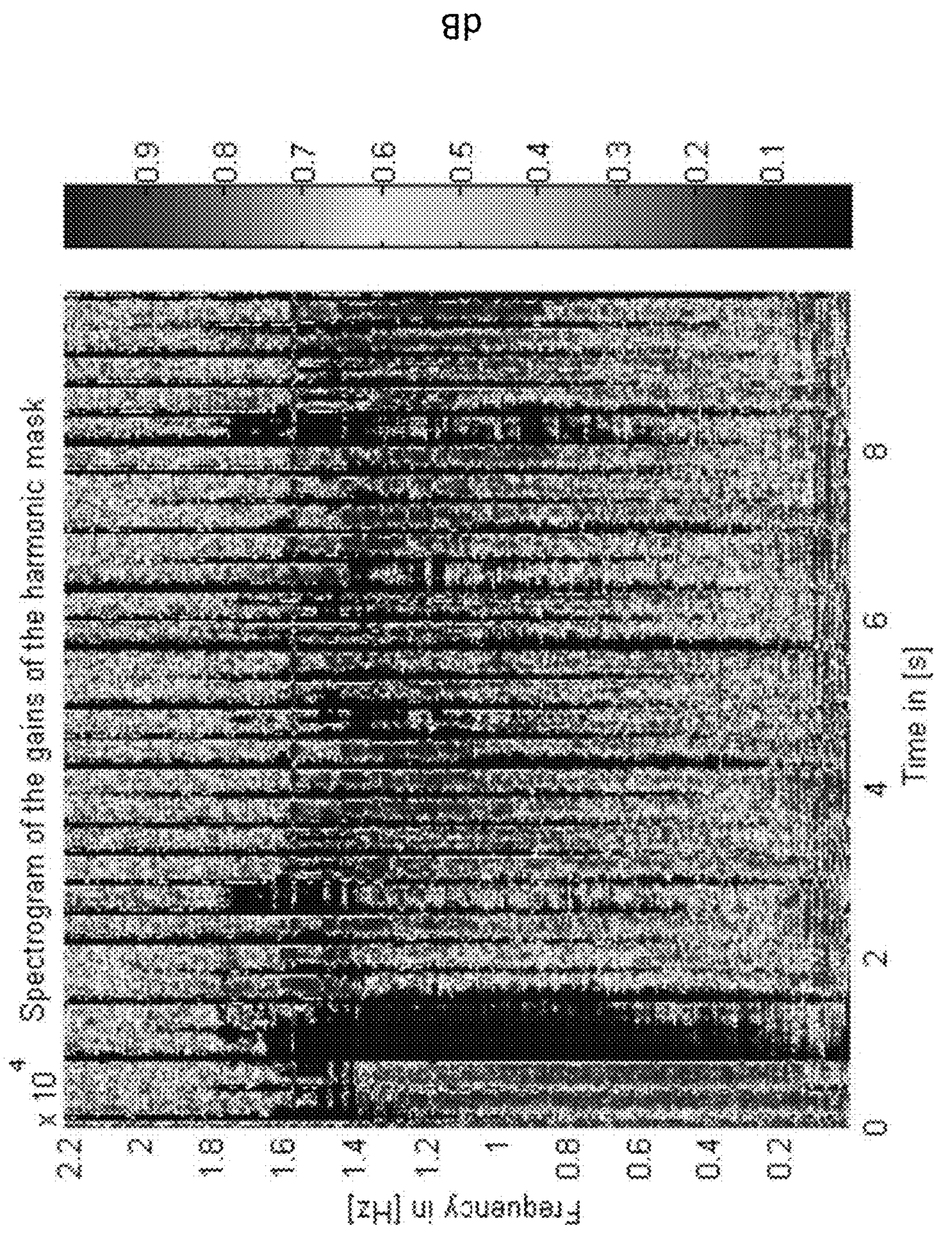
FIG. 11 shows an example of a spectrogram of the mask which is generated with the help of the non-linear smoothing filter of FIG. 2.

FIG. 11 shows the spectrogram of the mask in order to obtain the harmonic signal component. Here, the vertical dark stripes indicate a high signal suppression.

When FIGS. 8-11 are compared to FIGS. 4-7, one can deduce that the quality of the signal separation is not deteriorated when the non-linear smoothing filter of FIG. 2 is used compared to the implementation of the median filter, for which, however, a much higher computational effort and storage space are needed.

In the following, the non-linear filter 160 of FIG. 1, which corresponds to a polynom filter, is discussed in more detail. As can be deduced from FIG. 1, the spectrum of the transient signal components $\hat{T}$ (n, k) is transferred in the time domain by the inverse Fourier transform by entity 150. This signal is called $\hat{t}$ (n) in the following and represents the input signal of the non-linear filter 160. The functioning of the non-linear filter can be described as follows $$y(n)=\Sigma_{l=0}^{L} h_l \hat{t}^{l}(n), \quad (5)$$

with $h_1$ and l=0, L representing the coefficients of the non-linear filter of order L+1. Research has shown that good bass enhancement is obtained when coefficients for the simulation of a non-linear function are used which correspond to a root of the arc tangens function, which are approximated by the following coefficients $$h_1=[0.0001,2.7494,-1.0206,-1.0943,-0.1141,0.7023,-0.4382,-0.3744,0.5317,0.0997,-0.3682], \text{ with } l=0, \ldots ,9 \quad (6)$$

Figure 12:
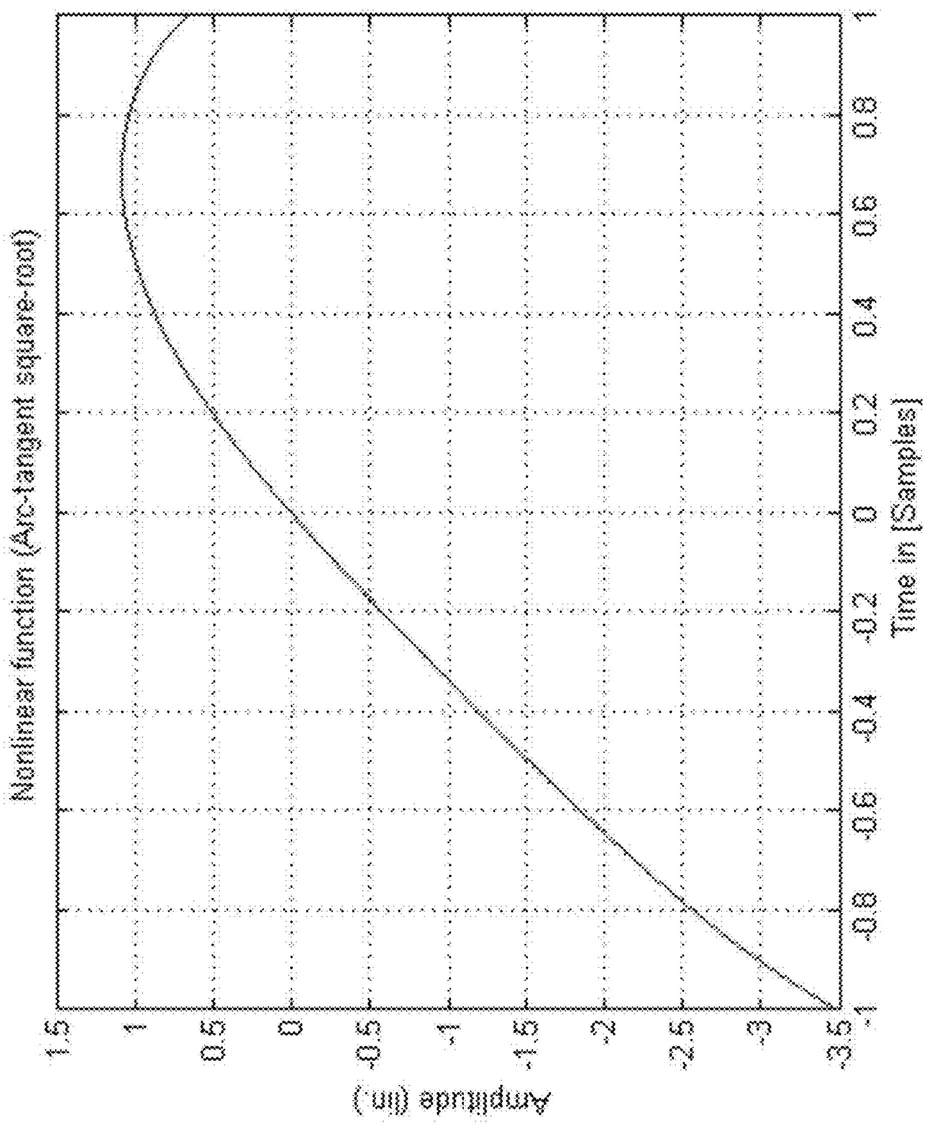
FIG. 12 shows a function used for the non-linear filter used in the system of FIG. 1.

Supposed that a typical input signal has input values from +1 to −1, a function obtained with formulae 5 and 6 is obtained as shown in FIG. 12.

Figure 13:
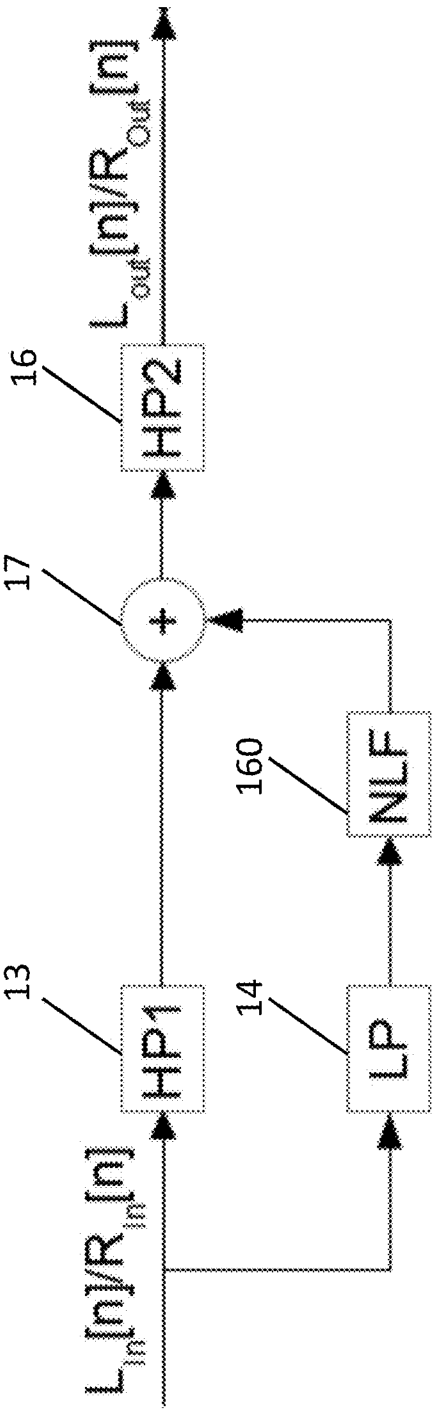
FIG. 13 shows a signal flow of a system used to verify the efficiency of the non-linear filter.
Figure 14:
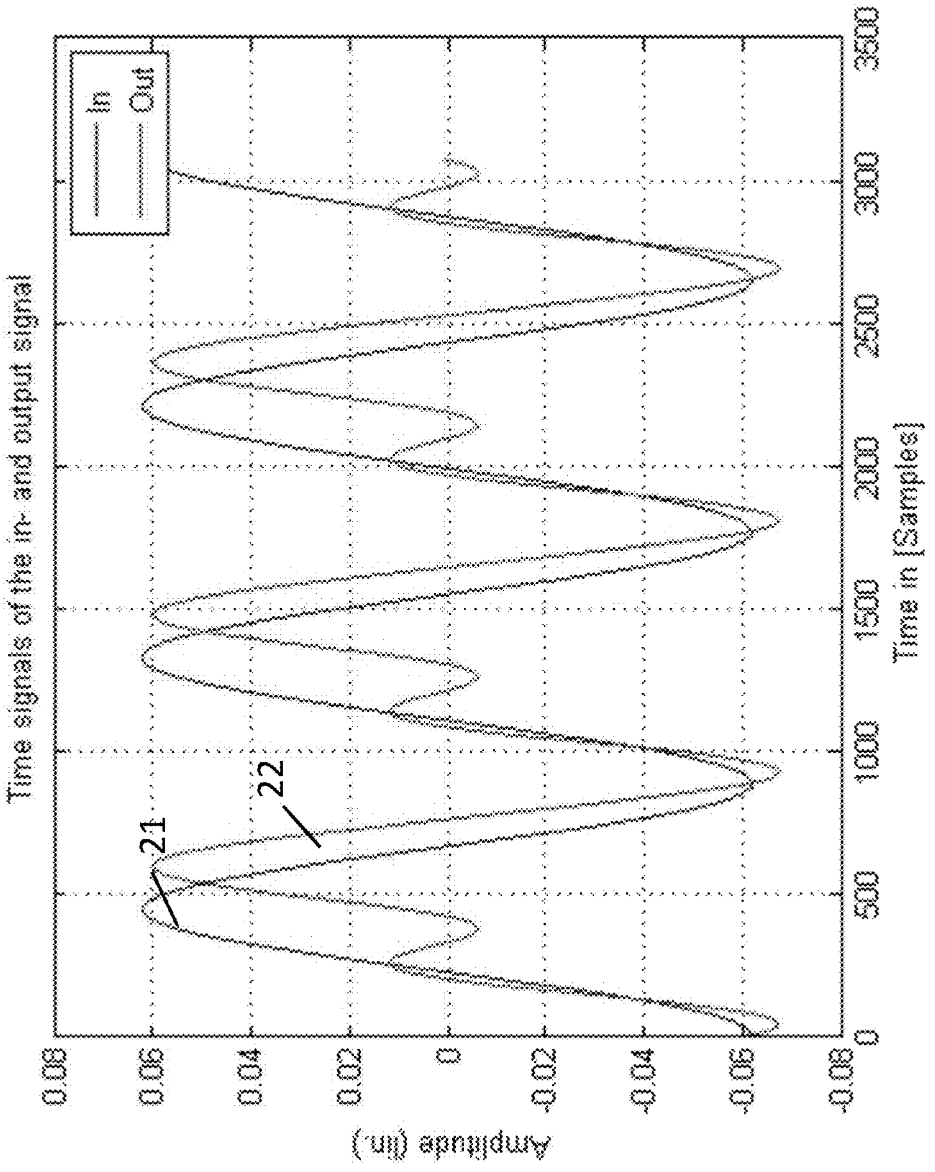
FIG. 14 shows the input signal and the output signal of the non-linear filter.
Figure 15:
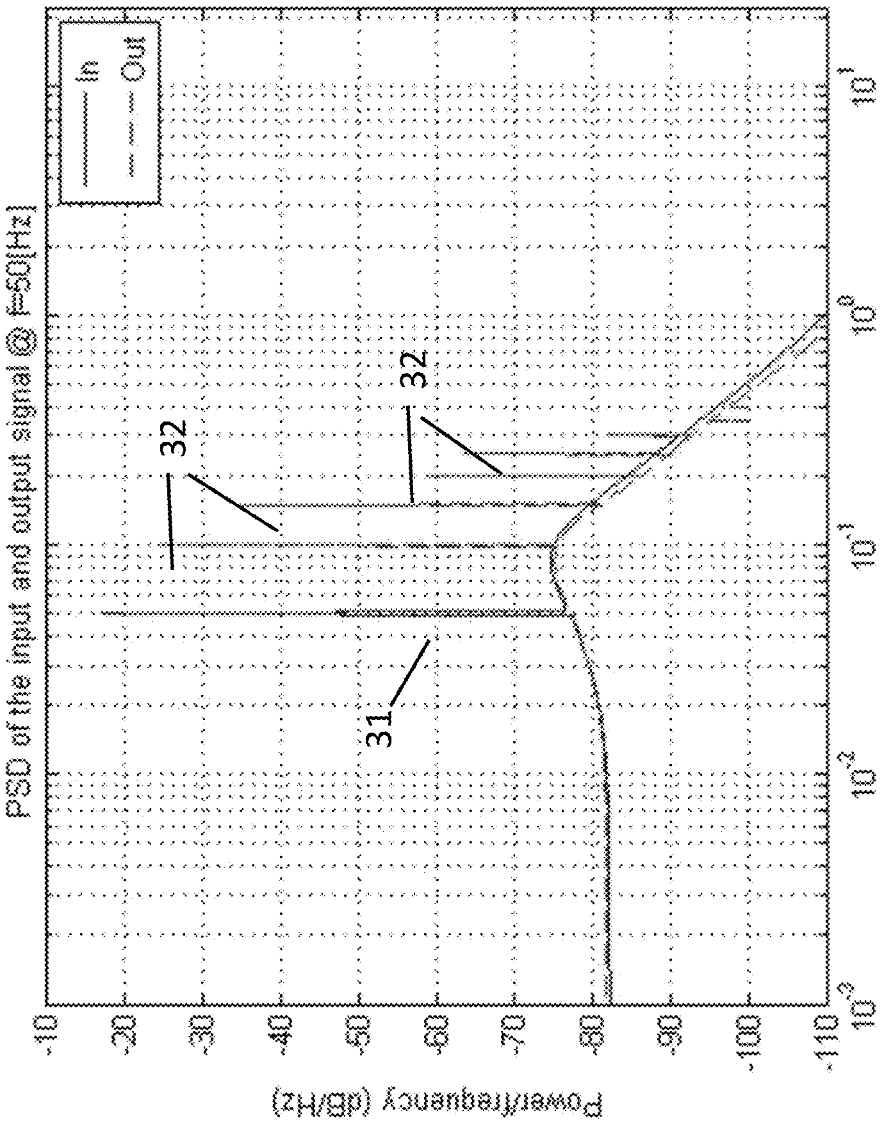
FIG. 15 shows an example of a power-density spectrum of the input and the output signal of the non-linear filter.

In order to show the function of the non-linear filter, a sinus signal of f=50 Hz was input as $\hat{t}$ (n) into the non-linear filter. In the method shown in FIG. 13, either the left or the right signal is input to high-pass filter 13 and is additionally passed through low-pass filter 14 and the non-linear filter 160 of FIG. 1. The two signal components are then combined and passed through a high-pass filter 16. As can be deduced from FIG. 13, the input signal is separated using a complementary crossover filter with the complementary high-pass and low-pass filters 13, 14. The filtered signals are then added in adder 17. The signal before the second high-pass filter, which has a better bass performance, is used to simulate a loudspeaker with a lower bass performance. In reality, the second high-pass filter 16 is not necessary, as normally, a loudspeaker with a suboptimal bass reproduction characteristic is used. The original signal $L_{in}$ or $R_{in}$ is compared to the output signal $L_{out}$ or $R_{out}$ for different types of music in order to assess the bass enhancement. The test results were positive and a definite bass enhancement was detected by the users. This can also be seen in FIG. 14, where the input signal is a sinus signal of 50 Hz, wherein the input signal is indicated as 21 and the output after the filter is 22. FIG. 14 indicates the signal in the time domain. However, as this is not very convincing, FIG. 15 indicates the power spectral density of the input and the output signals. The input signal shows one single peak at 50 Hz, with the input signal being indicated by reference numeral 31, wherein the output signal shows several higher harmonics 32 in addition. If the used loudspeaker can only output signal and frequencies above F≥100 Hz e.g., by using the corner frequency $F_c$ of 100 Hz at the high-pass filter 16 of FIG. 13, it is clear that the loudspeaker cannot output the basic wave at F=50 Hz. However, as the higher harmonics at F=100, 150, 200 Hz are obtained with the help of the non-linear filter, the hearing is able to simulate this fundamental oscillation of F=50 Hz so that the subjective impression is obtained as if it were present in the signal.

Figure 16:
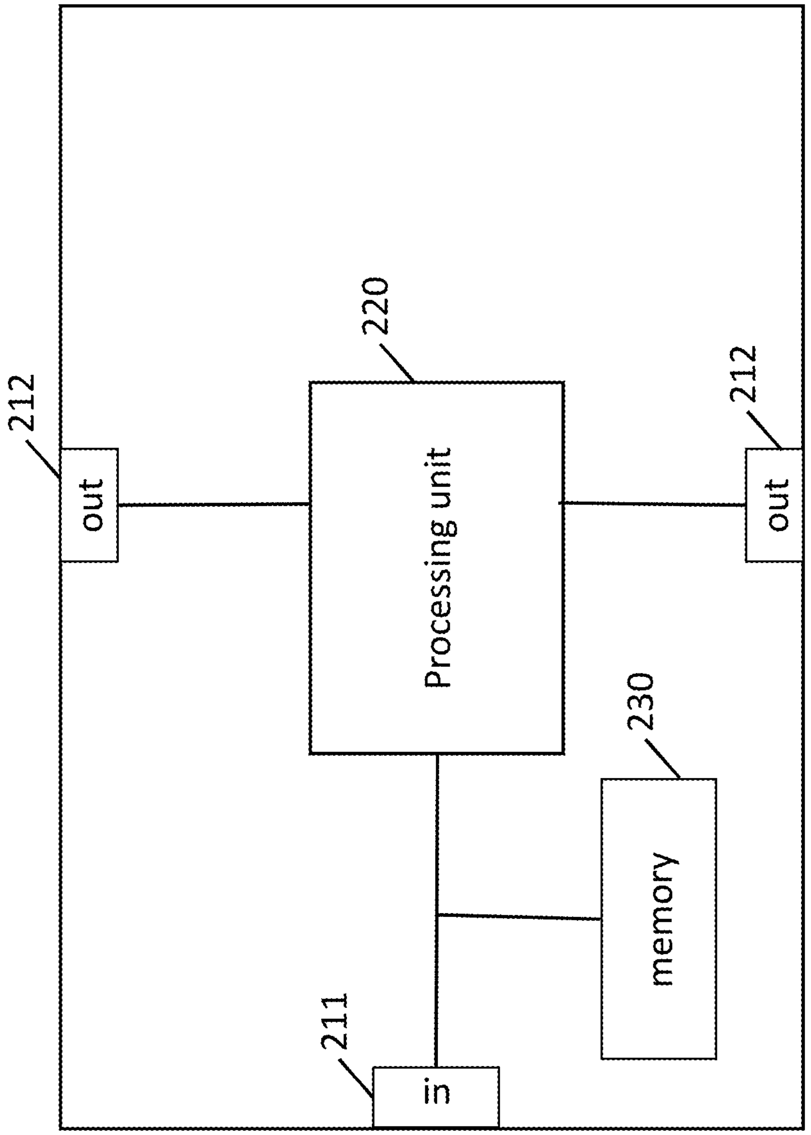
FIG. 16 shows a schematic architectural view of an entity configured to separate the audio signal into the harmonic and transient signal components used in FIG. 1.

FIG. 16 shows a more detailed view of a signal separation unit 200, where the signal separation is carried out. The signal separation unit 200 comprises an input 211 where the input signal after the Fourier transform at entity 120 is received. The signal separation unit then comprises a processing unit 220, where the above-discussed calculations such as the filtering of FIG. 2 and the generation of the masks are carried out. The signal separation unit 200 then comprises output 212 in order to output the transient signal component and the harmonic signal component.

Figure 17:
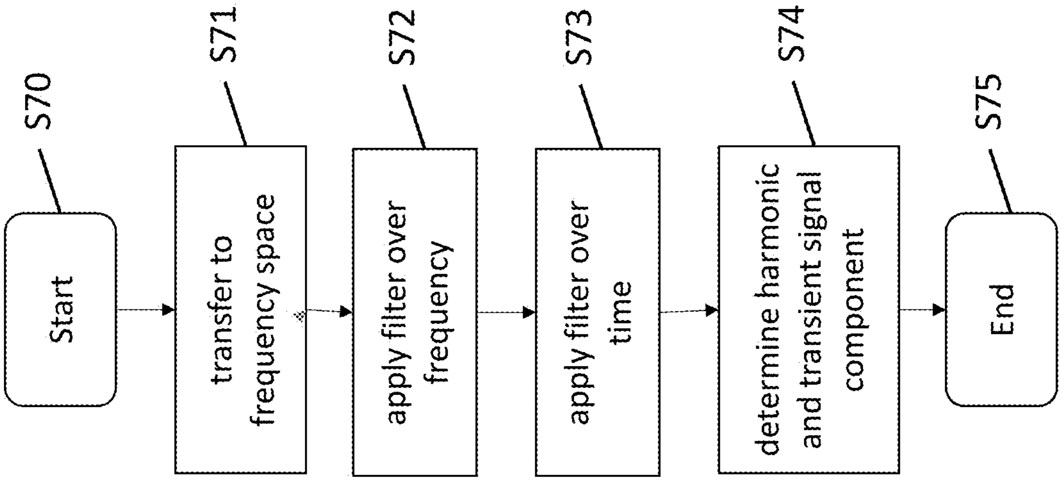
FIG. 17 shows a schematic flow chart of the steps carried out by the entity for a separation of the audio signal of FIG. 16.

FIG. 17 summarizes some of the steps carried out for the determination of the harmonic and transient signal components. The method starts at step S70 and then in step S71, the mono audio signal is transferred into the frequency space as indicated by entity 120 of FIG. 1. In step S72, the non-linear smoothing filter of FIG. 2 is applied over the frequency domain. In this step, the transferred audio signal as input signal to the non-linear smoothing filter is compared as input signal for one frequency component to an output signal of the non-linear smoothing filter of the neighboring frequency component, to which the non-linear smoothing filter has already been applied in order to get a new output signal of the non-linear smoothing filter for said one frequency component. In the same way, the non-linear smoothing filter is applied over time in step S73, where the transferred audio signal as input signal for the non-linear smoothing filter is used as input signal and one time component is compared to an output signal of the non-linear smoothing filter of a neighboring time component (per frequency bin), to which the non-linear smoothing filter has already been applied in order to get a new output signal of the non-linear smoothing filter for the current time component. In step S74, the transient and harmonic signal components are then determined based on the calculation of the corresponding masks utilizing formula 4. The method ends in step S75. The calculation steps of FIG. 17 may be carried out by the processing unit 220 of FIG. 16.

From the above-said, further general conclusions can be drawn. The application of the non-linear smoothing filter comprises the comparison of the transferred audio signal as input signal of a non-linear smoothing filter to an output signal of the non-linear smoothing filter to which the non-linear smoothing filter has already been applied and when the input signal is larger than the output signal, a new output signal of the non-linear smoothing filter to which the non-linear smoothing filter has already been applied is increased by a first amount and when the input signal is smaller than the output signal, then the output signal of the non-linear smoothing filter is decreased by a second amount.

The second amount can be larger than the first amount. The increment and decrement values $C_{Inc}$ and $C_{Dec}$ may be constant. In another embodiment, the two values $C_{Inc}$ and $C_{Dec}$ may also be adaptive, which means that $C_{Inc}$ starts with a first initial value and is then incremented by a first increment $\Delta C_{Inc}$ as long as the incrementation is applied until a maximum $C_{Inc\ max}$ is obtained. This value is then not increased any more. If the increment path of the signal processing of FIG. 2 is left and the decrement is applied, $C_{Inc}$ may be set again to the initial value $C_{Inc\ min}$. This approach avoids a too slow reaction to increasing signals as $C_{Inc}$ is normally smaller than $C_{Dec}$. In the same way $C_{Dec}$ may be adaptive so that $C_{Dec}$ starts with an initial value and is then incremented by a second increment $\Delta C_{Dec}$ as long as the decrementation is applied. The incrementation $\Delta C_{Dec}$ here means that the decrement becomes larger until a maximum $C_{Dec\ max}$ is obtained. If the decrement path is left, $C_{Dec}$ may be again set to the initial value $C_{Dec\ min}$.

Furthermore, when the input signal is smaller than the output signal, the new output signal of the non-linear smoothing filter is amended such that it does not become smaller than a minimum threshold.

Furthermore, the determination of the harmonic signal component and the transient signal component comprises the application of a harmonic filter mask $M_S$ determined based on filtered transient signal T (n, k) and on the filtered harmonic signal S (n, k) to the transferred audio signal and applying a transient filter mask $M_T$ determined based on the filtered transient signal T (n, k) and on the filtered harmonic signal S (n, k) to the transferred audio signal.

Furthermore, the signal separation unit comprising a processor and a memory is provided as discussed in connection with FIG. 16. The memory 230 contains instructions to be executed by the processor and the signal separation unit is operative to carry out the steps mentioned above in which unit 200 is involved. Furthermore, the signal separation unit may comprise different means for carrying out the steps in which the signal separation unit 200 is involved as mentioned above.

What is claimed is:

1. A method for separating an audio signal into a harmonic signal component and a transient signal component comprising the steps of:

transferring the audio signal into a frequency space to obtain a transferred audio signal in dependence on frequency and time;

applying a non-linear smoothing filter to the transferred audio signal over the frequency to obtain a filtered transient signal in which the harmonic signal component is suppressed relative to the transient signal component;

applying the non-linear smoothing filter to the transferred audio signal over time to obtain a filtered harmonic signal in which the transient signal component is suppressed relative to the harmonic signal component; and determining the harmonic signal component and the transient signal component based on the filtered harmonic signal and the filtered transient signal, wherein applying the non-linear smoothing filter over the frequency comprises applying the transferred audio signal as an input signal to the non-linear smoothing filter in which the input signal for one frequency component is compared to an output signal of the non-linear smoothing filter of a neighboring frequency component to which the non-linear smoothing filter has already been applied to obtain a new output signal of the non-linear smoothing filter for the one frequency component.

2. The method according to claim 1, wherein applying the non-linear smoothing filter over time comprises applying the transferred audio signal as input signal to the non-linear smoothing filter in which the input signal for one time component is compared to an output signal of the non-linear smoothing filter of a neighboring time component to which the non-linear smoothing filter has already been applied to obtain a new output signal of the non-linear smoothing filter for the one time component.

3. The method according to claim 1, wherein applying the non-linear smoothing filter comprises comparing the transferred audio signal as an input signal of the non-linear smoothing filter to an output signal of the non-linear smoothing filter to which the non-linear smoothing filter has already been applied, and when the input signal is larger than the output signal, a new output signal of the non-linear smoothing filter, to which the non-linear smoothing filter has already been applied, is increased by a first amount, wherein, when the input signal is smaller than the output signal, the new output signal of the non-linear smoothing filter is decreased by a second amount.

4. The method according to claim 3, wherein when the input signal is smaller than the output signal, the new output signal of the non-linear smoothing filter is amended such that new output signal does not become smaller than a minimum threshold.

5. The method according to claim 3, wherein the second amount is larger than the first amount.

6. The method according to claim 5, wherein a first value is used for the first amount when the new output signal is increased for a first time; and wherein the first value is increased by a first delta each time the new output signal is increased until a maximum first amount is obtained.

7. The method according to claim 6, wherein, when the new output signal is decreased by the second amount after an increase, the first value is used again for the first amount.

8. The method according to claim 1, wherein determining the harmonic signal component and the transient signal component comprises applying a harmonic filter mask determined based on the filtered transient signal and on the filtered harmonic signal to the transferred audio signal and applying a transient filter mask determined based on the filtered transient signal and on the filtered harmonic signal to the transferred audio signal.

9. A method for generating a bass enhanced audio signal based on harmonic continuation comprising the steps of:

separating the audio signal into a harmonic signal component and a transient signal component using the method of claim 1;

applying a non-linear function to the transient signal component to generate a distorted non-linear signal having desired non-linear distortions;

processing the enriched harmonic signal component in a phase vocoder to generate an enriched audio signal in which harmonic frequency components are added;

weighting the distorted non-linear signal and the enriched audio signal with corresponding weighting factors to provide a weighted distorted non-linear signal and a weighted enriched audio signal, respectively, and combining the weighted enriched audio signal and the weighted distorted non-linear signal to form the bass enhanced audio signal.

10. An apparatus for separating an audio signal into a harmonic signal component and a transient signal component, the apparatus comprising:

at least one processing unit configured to:

transfer the audio signal into a frequency space to obtain a transferred audio signal in dependence on frequency and time;

apply a non-linear smoothing filter to the transferred audio signal over frequency to obtain a filtered transient signal in which the harmonic signal component is suppressed relative to the transient signal component;

apply the non-linear smoothing filter to the transferred audio signal over time to obtain a filtered harmonic signal in which the transient signal component is suppressed relative to the harmonic signal component, and determine the harmonic signal component and the transient signal component based on the filtered harmonic signal and the filtered transient signal, wherein the at least one processing unit is further configured to apply the transferred audio signal as an input signal to the non-linear smoothing filter in which the input signal for one frequency component is compared to an output signal of the non-linear smoothing filter of a neighboring frequency component to which the non-linear smoothing filter has already been applied to obtain a new output signal of the non-linear smoothing filter for the one frequency component.

11. The apparatus of claim 10 wherein the at least one processing unit is further configured to apply the transferred audio signal as an input signal to the non-linear smoothing filter in which the input signal for one time component is compared to an output signal of the non-linear smoothing filter of a neighboring time component to which the non-linear smoothing filter has already been applied to obtain a new output signal of the non-linear smoothing filter for the one time component.

12. The apparatus of claim 10 wherein the at least one processing unit is further configured to compare the transferred audio signal as an input signal of the non-linear smoothing filter to an output signal of the non-linear smoothing filter to which the non-linear smoothing filter has already been applied, and when the input signal is larger than the output signal, a new output signal of the non-linear smoothing filter, to which the non-linear smoothing filter has already been applied, is increased by a first amount, wherein, when the input signal is smaller than the output signal, the new output signal of the non-linear smoothing filter is decreased by a second amount.

13. The apparatus of claim 12, wherein the second amount is larger than the first amount.

14. The apparatus of claim 13, wherein a first value is used for the first amount when the new output signal is increased for a first time, and wherein the first value is increased by a first delta each time the new output signal is increased until a maximum first amount is obtained.

15. An audio component configured to generate a bass enhanced audio signal based on harmonic continuation comprising:

a loudspeaker, and a signal separation unit configured to separate an audio signal into a harmonic signal component and a transient signal component as mentioned in claim 10, wherein the loudspeaker is to output a signal based on the harmonic signal component and the transient signal component.

16. A computer program comprising program code to be executed by at least one processing unit configured to separate an audio signal into a harmonic signal component and a transient signal component, wherein execution of the program code includes:

transferring the audio signal into a frequency space to obtain a transferred audio signal in dependence on frequency and time;

applying a non-linear smoothing filter to the transferred audio signal over the frequency to obtain a filtered transient signal in which the harmonic signal component is suppressed relative to the transient signal component;

applying the non-linear smoothing filter to the transferred audio signal over time to obtain a filtered harmonic signal in which the transient signal component is suppressed relative to the harmonic signal component; and determining the harmonic signal component and the transient signal component based on the filtered harmonic signal and the filtered transient signal, wherein applying the non-linear smoothing filter over the frequency comprises applying the transferred audio signal as an input signal to the non-linear smoothing filter in which the input signal for one frequency component is compared to an output signal of the non-linear smoothing filter of a neighboring frequency component to which the non-linear smoothing filter has already been applied to obtain a new output signal of the non-linear smoothing filter for the one frequency component.

17. The computer program of claim 16 wherein applying the non-linear smoothing filter over time comprises applying the transferred audio signal as input signal to the non-linear smoothing filter in which the input signal for one time component is compared to an output signal of the non-linear smoothing filter of a neighboring time component to which the non-linear smoothing filter has already been applied to obtain a new output signal of the non-linear smoothing filter for the one time component.

18. A method for separating an audio signal into a harmonic signal component and a transient signal component comprising the steps of:

transferring the audio signal into a frequency space to obtain a transferred audio signal in dependence on frequency and time;

applying a non-linear smoothing filter to the transferred audio signal over the frequency to obtain a filtered transient signal in which the harmonic signal component is suppressed relative to the transient signal component;

applying the non-linear smoothing filter to the transferred audio signal over time to obtain a filtered harmonic signal in which the transient signal component is suppressed relative to the harmonic signal component; and determining the harmonic signal component and the transient signal component based on the filtered harmonic signal and the filtered transient signal, wherein applying the non-linear smoothing filter over time comprises applying the transferred audio signal as input signal to the non-linear smoothing filter in which the input signal for one time component is compared to an output signal of the non-linear smoothing filter of a neighboring time component to which the non-linear smoothing filter has already been applied to obtain a new output signal of the non-linear smoothing filter for the one time component.

19. A method for separating an audio signal into a harmonic signal component and a transient signal component comprising the steps of:

transferring the audio signal into a frequency space to obtain a transferred audio signal in dependence on frequency and time;

applying a non-linear smoothing filter to the transferred audio signal over the frequency to obtain a filtered transient signal in which the harmonic signal component is suppressed relative to the transient signal component;

applying the non-linear smoothing filter to the transferred audio signal over time to obtain a filtered harmonic signal in which the transient signal component is suppressed relative to the harmonic signal component; and determining the harmonic signal component and the transient signal component based on the filtered harmonic signal and the filtered transient signal, wherein applying the non-linear smoothing filter comprises comparing the transferred audio signal as an input signal of the non-linear smoothing filter to an output signal of the non-linear smoothing filter to which the non-linear smoothing filter has already been applied, and when the input signal is larger than the output signal, a new output signal of the non-linear smoothing filter, to which the non-linear smoothing filter has already been applied, is increased by a first amount, wherein, when the input signal is smaller than the output signal, the new output signal of the non-linear smoothing filter is decreased by a second amount.

20. A method for separating an audio signal into a harmonic signal component and a transient signal component comprising the steps of:

transferring the audio signal into a frequency space to obtain a transferred audio signal in dependence on frequency and time;

applying a non-linear smoothing filter to the transferred audio signal over the frequency to obtain a filtered transient signal in which the harmonic signal component is suppressed relative to the transient signal component;

applying the non-linear smoothing filter to the transferred audio signal over time to obtain a filtered harmonic signal in which the transient signal component is suppressed relative to the harmonic signal component; and determining the harmonic signal component and the transient signal component based on the filtered harmonic signal and the filtered transient signal, wherein determining the harmonic signal component and the transient signal component comprises applying a harmonic filter mask determined based on the filtered transient signal and on the filtered harmonic signal to the transferred audio signal and applying a transient filter mask determined based on the filtered transient signal and on the filtered harmonic signal to the transferred audio signal.

21. An apparatus for separating an audio signal into a harmonic signal component and a transient signal component, the apparatus comprising:

at least one processing unit configured to:

transfer the audio signal into a frequency space to obtain a transferred audio signal in dependence on frequency and time;

apply a non-linear smoothing filter to the transferred audio signal over frequency to obtain a filtered transient signal in which the harmonic signal component is suppressed relative to the transient signal component;

apply the non-linear smoothing filter to the transferred audio signal over time to obtain a filtered harmonic signal in which the transient signal component is suppressed relative to the harmonic signal component, and determine the harmonic signal component and the transient signal component based on the filtered harmonic signal and the filtered transient signal, wherein the at least one processing unit is further configured to apply the transferred audio signal as an input signal to the non-linear smoothing filter in which the input signal for one time component is compared to an output signal of the non-linear smoothing filter of a neighboring time component to which the non-linear smoothing filter has already been applied to obtain a new output signal of the non-linear smoothing filter for the one time component.

22. An apparatus for separating an audio signal into a harmonic signal component and a transient signal component, the apparatus comprising:

at least one processing unit configured to:

transfer the audio signal into a frequency space to obtain a transferred audio signal in dependence on frequency and time;

apply a non-linear smoothing filter to the transferred audio signal over frequency to obtain a filtered transient signal in which the harmonic signal component is suppressed relative to the transient signal component;

apply the non-linear smoothing filter to the transferred audio signal over time to obtain a filtered harmonic signal in which the transient signal component is suppressed relative to the harmonic signal component, and determine the harmonic signal component and the transient signal component based on the filtered harmonic signal and the filtered transient signal, wherein the at least one processing unit is further configured to compare the transferred audio signal as an input signal of the non-linear smoothing filter to an output signal of the non-linear smoothing filter to which the non-linear smoothing filter has already been applied, and when the input signal is larger than the output signal, a new output signal of the non-linear smoothing filter, to which the non-linear smoothing filter has already been applied, is increased by a first amount, wherein, when the input signal is smaller than the output signal, the new output signal of the non-linear smoothing filter is decreased by a second amount.

23. A computer program comprising program code to be executed by at least one processing unit configured to separate an audio signal into a harmonic signal component and a transient signal component, wherein execution of the program code includes:

transferring the audio signal into a frequency space to obtain a transferred audio signal in dependence on frequency and time;

applying a non-linear smoothing filter to the transferred audio signal over the frequency to obtain a filtered transient signal in which the harmonic signal component is suppressed relative to the transient signal component;

applying the non-linear smoothing filter to the transferred audio signal over time to obtain a filtered harmonic signal in which the transient signal component is suppressed relative to the harmonic signal component; and determining the harmonic signal component and the transient signal component based on the filtered harmonic signal and the filtered transient signal, wherein applying the non-linear smoothing filter over time comprises applying the transferred audio signal as input signal to the non-linear smoothing filter in which the input signal for one time component is compared to an output signal of the non-linear smoothing filter of a neighboring time component to which the non-linear smoothing filter has already been applied to obtain a new output signal of the non-linear smoothing filter for the one time component.

* * * * *